US012740482B2

(12) United States Patent
Baek et al.

(10) Patent No.: US 12,740,482 B2
(45) Date of Patent: Sep. 15, 2026

(54) SEMICONDUCTOR PACKAGE

(71) Applicant: SAMSUNG ELECTRONICS CO., LTD., Suwon-si (KR)

(72) Inventors: Joonghyun Baek, Suwon-si (KR); In Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 411 days.

(21) Appl. No.: 18/308,358

(22) Filed: Apr. 27, 2023

(65) Prior Publication Data

US 2024/0071997 A1 Feb. 29, 2024

(30) Foreign Application Priority Data

Aug. 29, 2022 (KR) ........................ 10-2022-0108392

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 70/611* (2026.01); *H10W 70/65* (2026.01); *H10W 90/401* (2026.01); *H10W 90/701* (2026.01); *H10W 72/07554* (2026.01); *H10W 72/5445* (2026.01); *H10W 72/865* (2026.01); *H10W 72/877* (2026.01); *H10W 72/879* (2026.01); *H10W 72/884* (2026.01);
(Continued)

(58) Field of Classification Search
CPC ..... H01L 25/0652; H01L 24/49; H01L 24/73; H01L 2225/06506; H01L 2225/0651; H01L 23/5389; H01L 24/97; H01L 25/0657; H10B 80/00
See application file for complete search history.

(56) References Cited

U.S. PATENT DOCUMENTS 7,989,960 B2 8/2011 Shinohara et al.
9,502,390 B2 11/2016 Caskey et al.
(Continued)

FOREIGN PATENT DOCUMENTS

KR 20120090718 A 8/2012
KR 20140024593 A 3/2014
(Continued)

*Primary Examiner* — Sue A Purvis
(74) *Attorney, Agent, or Firm* — Wolf, Greenfield & Sacks, P.C.

(57) ABSTRACT

A semiconductor package includes: a substrate that includes a wiring circuit; an interposer on the substrate, wherein the interposer includes a first side and a second side opposing each other and a third side and a fourth side between the first side and the second side, and wherein the interposer includes an interconnect circuit electrically connected to the wiring circuit; a first and second buffer chips on the interposer; a first chip stack adjacent to the first side of the interposer and connected to the first buffer chip; a second chip stack adjacent to the second side of the interposer and connected to the second buffer chip; a third chip stack adjacent to the third side of the interposer, and wherein the third chip stack includes first and second groups of semiconductor chips, which are electrically connected to the first and second buffer chips, respectively, via the interconnect circuit.

20 Claims, 17 Drawing Sheets

100A

I-I'

(51) Int. Cl.
*H10W 70/60* (2026.01)
*H10W 70/65* (2026.01)
*H10W 72/00* (2026.01)
*H10W 72/50* (2026.01)

(52) U.S. Cl.
CPC ........ *H10W 90/732* (2026.01); *H10W 90/734* (2026.01); *H10W 90/752* (2026.01); *H10W 90/753* (2026.01); *H10W 90/754* (2026.01)

(56) References Cited

U.S. PATENT DOCUMENTS

| | | | | |
|---|---|---|---|---|
| 11,222,882 | B2 * | 1/2022 | Kim | H01L 23/481 |
| 2007/0065987 | A1 | 3/2007 | Mess et al. | |
| 2013/0214432 | A1 | 8/2013 | Wu et al. | |
| 2014/0048947 | A1 | 2/2014 | Lee et al. | |
| 2015/0125993 | A1 | 5/2015 | Lee et al. | |
| 2015/0200187 | A1 * | 7/2015 | Park | H01L 24/49 257/777 |
| 2017/0125378 | A1 | 5/2017 | Park et al. | |
| 2017/0170156 | A1 * | 6/2017 | Hong | H10W 90/00 |
| 2020/0105734 | A1 * | 4/2020 | Akada | H10W 90/00 |
| 2021/0193637 | A1 * | 6/2021 | Jeng | H01L 23/5384 |
| 2023/0110997 | A1 * | 4/2023 | Otsuka | H01L 25/0652 257/777 |

FOREIGN PATENT DOCUMENTS

| | | | |
|---|---|---|---|
| KR | 101607981 | B1 | 3/2016 |
| KR | 10-2021-0077290 | A | 6/2021 |
| KR | 10-2022-0055112 | A | 5/2022 |

* cited by examiner

SEMICONDUCTOR PACKAGE

CROSS-REFERENCE TO RELATED APPLICATION(S)

This application claims benefit of priority to Korean Patent Application No. 10-2022-0108392 filed on Aug. 29, 2022 in the Korean Intellectual Property Office, the disclosure of which is incorporated herein by reference in its entirety.

BACKGROUND

The present disclosure relates to a semiconductor package.

With recent demand for higher performance and higher integration of semiconductor packages, semiconductor packages including a plurality of semiconductor chips and having an improved input/output speed thereof have been developed.

SUMMARY

Example embodiments provide a semiconductor package including a plurality of semiconductor chips and having an increased response speed.

According to an example embodiment, a semiconductor package includes: a substrate that includes a wiring circuit; an interposer on the substrate, wherein the interposer includes a first side and a second side opposing each other and a third side and a fourth side between the first side and the second side, and wherein the interposer includes an interconnect circuit electrically connected to the wiring circuit; a first buffer chip on the interposer; a second buffer chip on the interposer, wherein the second buffer chip is spaced apart from the first buffer chip; a first chip stack on the substrate, wherein the first chip stack is adjacent to the first side of the interposer and electrically connected to the first buffer chip; a second chip stack on the substrate, wherein the second chip stack is adjacent to the second side of the interposer and electrically connected to the second buffer chip; a third chip stack on the substrate, wherein the third chip stack is adjacent to the third side of the interposer, and wherein the third chip stack includes a first group of semiconductor chips, which is electrically connected to the first buffer chip via the interconnect circuit of the interposer, and a second group of semiconductor chips, which is electrically connected to the second buffer chip via the interconnect circuit of the interposer; an encapsulant on the interposer, the first chip stack, the second chip stack, and the third chip stack; and connection bumps on the substrate and electrically connected to the wiring circuit. According to an example embodiment, a semiconductor package includes: a substrate; an interposer on the substrate; a first buffer chip on the interposer; a second buffer chip on the interposer, wherein the second buffer chip is spaced apart from the first buffer chip; a first chip stack on the substrate, wherein the first chip stack is adjacent to a first side of the interposer and directly, electrically connected to the first buffer chip by a first conductive wire; a second chip stack on the substrate, wherein the second chip stack is adjacent to a second side of the interposer and directly, electrically connected to the second buffer chip by a second conductive wire; and a third chip stack on the substrate, wherein the third chip stack is adjacent to a third side of the interposer and electrically connected to the interposer, the first buffer chip, and the second buffer chip by a third conductive wire.

According to an example embodiment, a semiconductor package includes: a substrate that includes a wiring circuit; an interposer on the substrate, wherein the interposer includes an interconnect circuit that is electrically connected to the wiring circuit; a first buffer chip on the interposer; a second buffer chip on the interposer, wherein the second buffer chip is spaced apart from the first buffer chip; and chip stacks on the substrate, wherein the chip stacks are adjacent to the interposer, wherein each of the chip stacks includes a plurality of semiconductor chips stacked vertically, a first subset of chip stacks, among the chip stacks is directly, electrically connected to the first buffer chip and/or the second buffer chip, and a second subset of chip stacks, among the chip stacks is electrically connected to the first buffer chip and/or the second buffer chip via the interconnect circuit.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1A:
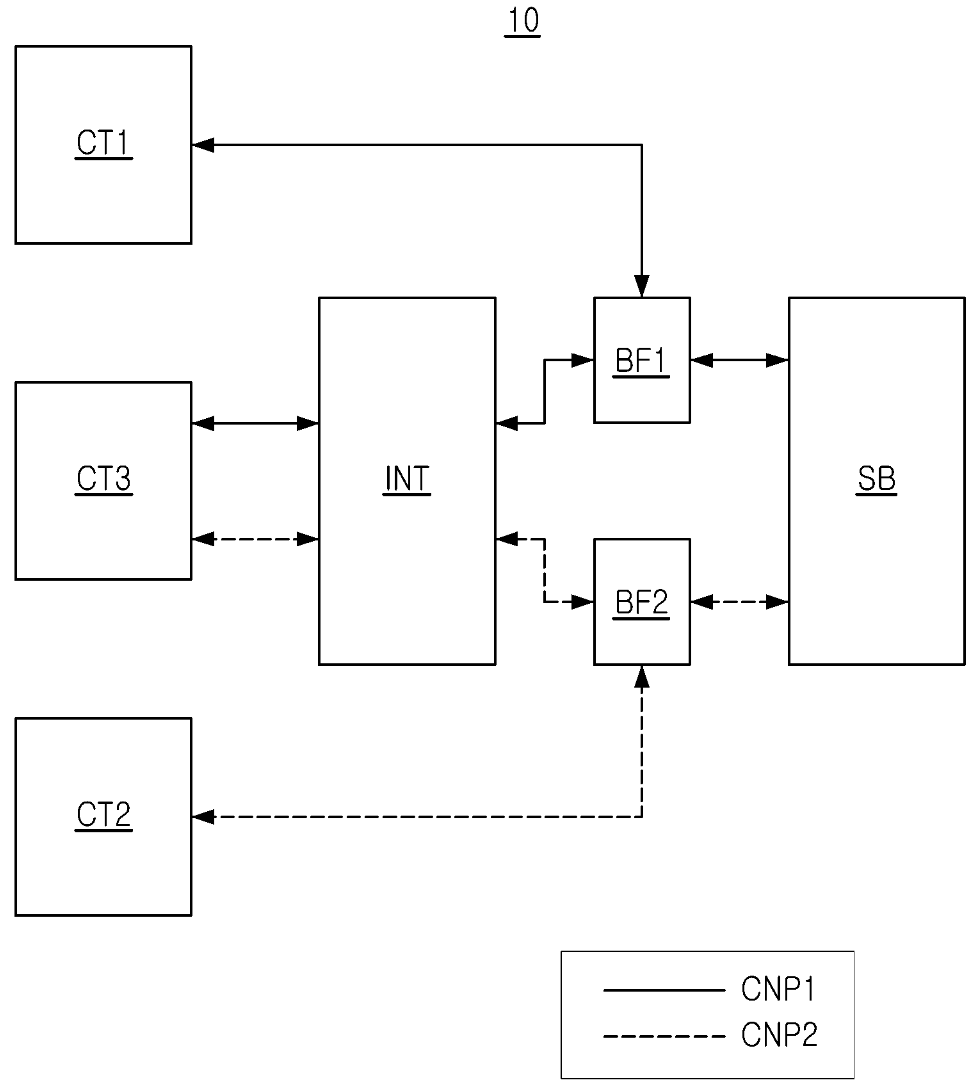
FIG. 1A is a conceptual diagram of a signal transmission system in a semiconductor package according to an example embodiment.
Figure 1B:
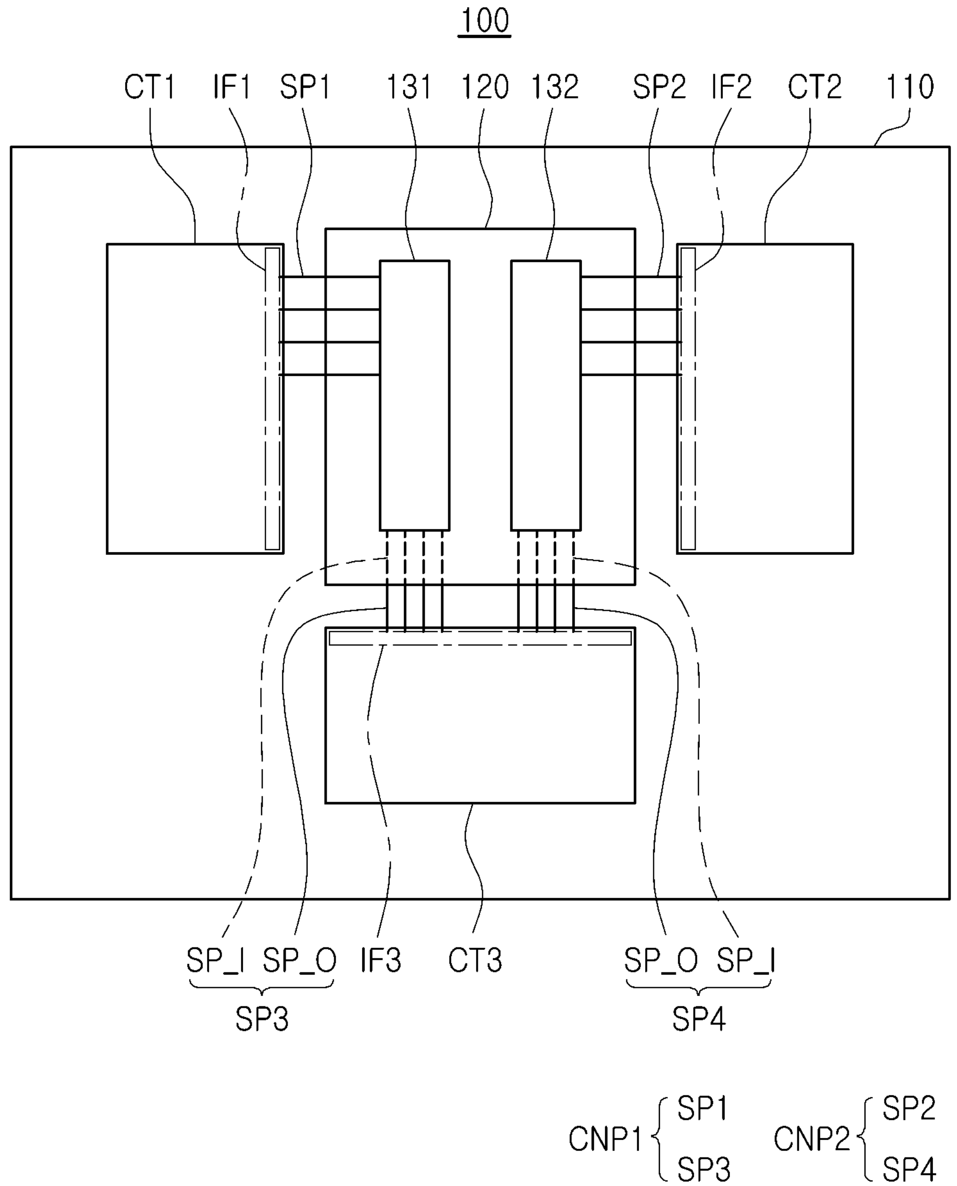
FIG. 1B is a schematic diagram of a semiconductor package according to an example embodiment.

FIG. 1A is a conceptual diagram of a signal transmission system 10 in a semiconductor package 100 according to an example embodiment, and FIG. 1B is a schematic diagram of a semiconductor package 100 according to an example embodiment.

Referring to FIG. 1A, the signal transmission system 10 according to an example embodiment may include a plurality of chip structures CT1, CT2, and CT3, an interposer portion INT, a plurality of buffers BF1 and BF2, and an external connection portion SB.

For example, the plurality of chip structures CT1, CT2, and CT3 may include a first chip structure CT1, a second chip structure CT2, and a third chip structure CT3.

For example, the plurality of buffers BF1 and BF2 may include a first buffer BF1 and a second buffer BF2.

The plurality of chip structures CT1, CT2, and CT3 may be electrically connected to the plurality of buffers BF1 and BF2 through a plurality of connection paths CNP1 and CNP2. For example, the plurality of connection paths CNP1 and CNP2 may include a first connection path CNP1 and a second connection path CNP2. The plurality of chip structures CT1, CT2, and CT3 may include a memory chip, for example, a volatile memory semiconductor chip such as a dynamic random-access memory (DRAM) or a nonvolatile memory semiconductor chip such as a flash memory.

Among the plurality of chip structures CT1, CT2, and CT3, some chip structures may be directly (e.g., without the interposer portion INT therebetween) connected to the plurality of buffers BF1 and BF2, and the other chip structures may be connected to the plurality of buffers BF1 and BF2 through the interposer portion INT. Accordingly, the signal transmission system 10 may be implemented as a high-capacity signal transmission system by the plurality of chip structures CT1, CT2, and CT3, including a chip structure (for example, the third chip structure CT3), which may be difficult to be directly (e.g., without the interposer portion INT therebetween) connected to the plurality of buffers BF1 and BF2, may be connected to the plurality of buffers BF1 and BF2 by the interposer portion INT. Thus, a response speed of the plurality of chip structures CT1, CT2 and CT3 may be increased.

The plurality of buffers BF1 and BF2 may be connected to the external connection portion SB through the first connection path CNP1 and the second connection path CNP2, respectively. The external connection portion SB may transmit a signal and/or data of the plurality of chip structures CT1, CT2, and CT3, received through the plurality of buffers BF1 and BF2, to an external device, not illustrated, (for example, a controller chip) or may receive command and address signals from an external device, not illustrated.

For example, the first chip structure CT1 may be directly and electrically connected to the first buffer BF1 through the first connection path CNP1, and a first portion of capacity (for example, 50% of capacity) of the third chip structure CT3 may be connected to the first buffer BF1 through the first connection path CNP1 via the interposer portion INT.

For example, the second chip structure CT2 may be directly and electrically connected to the second buffer BF2 through the second connection path CNP2, and a second portion of capacity (for example, the other 50% of capacity) of the third chip structure CT3 may be connected to the second buffer BF2 through the second connection path CNP2 via the interposer portion INT. The capacity hereinafter may be a memory capacity indicating data storage capability.

The first connection path CNP1 and the second connection path CNP2, illustrated in the drawings, may be understood as being transmission paths of data signals. The signal transmission system 10 according to an example embodiment may further include power/ground paths, not illustrated. The power/ground paths, not illustrated, may be connected to the plurality of chip structures CT1, CT2, and CT3 and the plurality of buffers BF1 and BF2 through the external connection portion SB and/or the interposer portion INT.

Referring to FIG. 1B, a semiconductor package 100 according to an example embodiment may include a substrate 110, an interposer 120, buffer chips 131 and 132, and a plurality of chip structures CT1, CT2, and CT3. For example, the plurality of chip structures CT1, CT2, and CT3 may include a first chip structure CT1, a second chip structure CT2, and a third chip structure CT3. For example, the buffer chips 131 and 132 may include a first buffer chip 131 and a second buffer chip 132.

The substrate 110 may be an element corresponding to the external connection portion SB in FIG. 1A, and may include a wiring circuit, electrically connected to the first and second buffer chips 131 and 132 and/or the interposer 120, as a support substrate on which the interposer 120 and the plurality of chip structures CT1, CT2, and CT3 are mounted. The wiring circuit may be configured to transmit externally received command and address signals for the plurality of chip structures CT1, CT2, and CT3 to the buffer chips 131 and 132, or may be configured to transmit signals and/or data of the plurality of chip structures CT1, CT2, and CT3, received through the buffer chips 131 and 132, to an external entity. Also, the wiring circuit may be configured to apply a power supply voltage and/or a ground voltage to the buffer chips 131 and 132 and the plurality of chip structures CT1, CT2, and CT3.

The interposer 120 may be disposed on the substrate 110 and may have an internal signal path SP_I connected to the first and second buffer chips 131 and 132. According to example embodiments, the interposer 120 may be electrically connected to the substrate 110 to transmit signals and/or data, received through the buffer chips 131 and 132, to an external entity, or to transmit externally received commands and address signals to the buffer chips 131 and 132.

The buffer chips 131 and 132 may be spaced apart from each other on the interposer 120 and may each form a channel communicating with an external entity. For example, the first buffer chip 131 may be connected to the first and third chip structures CT1 and CT3 to form one or more channels, and the second buffer chip 132 may be connected to the second chip structure CT2 and the third chip structure CT3 to form one or more channels. The number of channels, communicating with the external entity by the first and second buffer chips 131 and 132, may be even, such as two, four, six, or the like, but example embodiments are not limited thereto. The buffer chips 131 and 132 may include a buffer circuit controlling loading of the plurality of chip structures CT1, CT2, and CT3. The buffer chips 131 and 132 may include, for example, a frequency boosting interface (FBI) chip.

The plurality of chip structures CT1, CT2, and CT3 may include the first chip structure CT1, the second chip structure CT2, and the third chip structure CT3 disposed to be adjacent to the interposer 120. According to example embodiments, the plurality of chip structures CT1, CT2, and CT3 may be disposed in a larger number (for example, four, five, or the like) than the number (three) of those illustrated in the drawing. Each of the plurality of chip structures CT1, CT2, and CT3 may be a chip stack, including a plurality of semiconductor chips stacked vertically.

The first chip structure CT1 may include a first interface region IF1 disposed to be adjacent to the interposer 120. The first interface region IF1 may be electrically connected to the first buffer chip 131 through a first signal path SP1.

The second chip structure CT2 may include a second interface region IF2 disposed to be adjacent to the interposer 120. The second interface region IF2 may be electrically connected to the second buffer chip 132 through a second signal path SP2.

The third chip structure CT3 may include a third interface region IF3 disposed to be adjacent to the interposer 120. The third interface region IF3 may be connected to the first buffer chip 131 and the second buffer chip 132 through a third signal path SP3 and a fourth signal path SP4, respectively. The third signal path SP3 and the fourth signal path SP4 may each include an external signal path SP_O and the internal signal path SP_I. The internal signal path SP_I may be in the interposer 120. As an example, half of capacity of the third chip structure CT3 may be connected to the first buffer chip 131 through the third signal path SP3, and the other half of the capacity may be connected to the second buffer chip 132 through the fourth signal path SP4, but example embodiments are not limited thereto.

As described above, among the plurality of chip structures CT1, CT2, and CT3, at least one chip structure (for example, the third chip structure CT3) may be connected to the buffer chips 131 and 132 using the internal signal path SP_I of the interposer 120 to implement a semiconductor package 100 having an increased response speed of the plurality of chip structures CT1, CT2, and CT3 while including a larger number of the plurality of chip structures CT1, CT2, and CT3.

Figure 2:
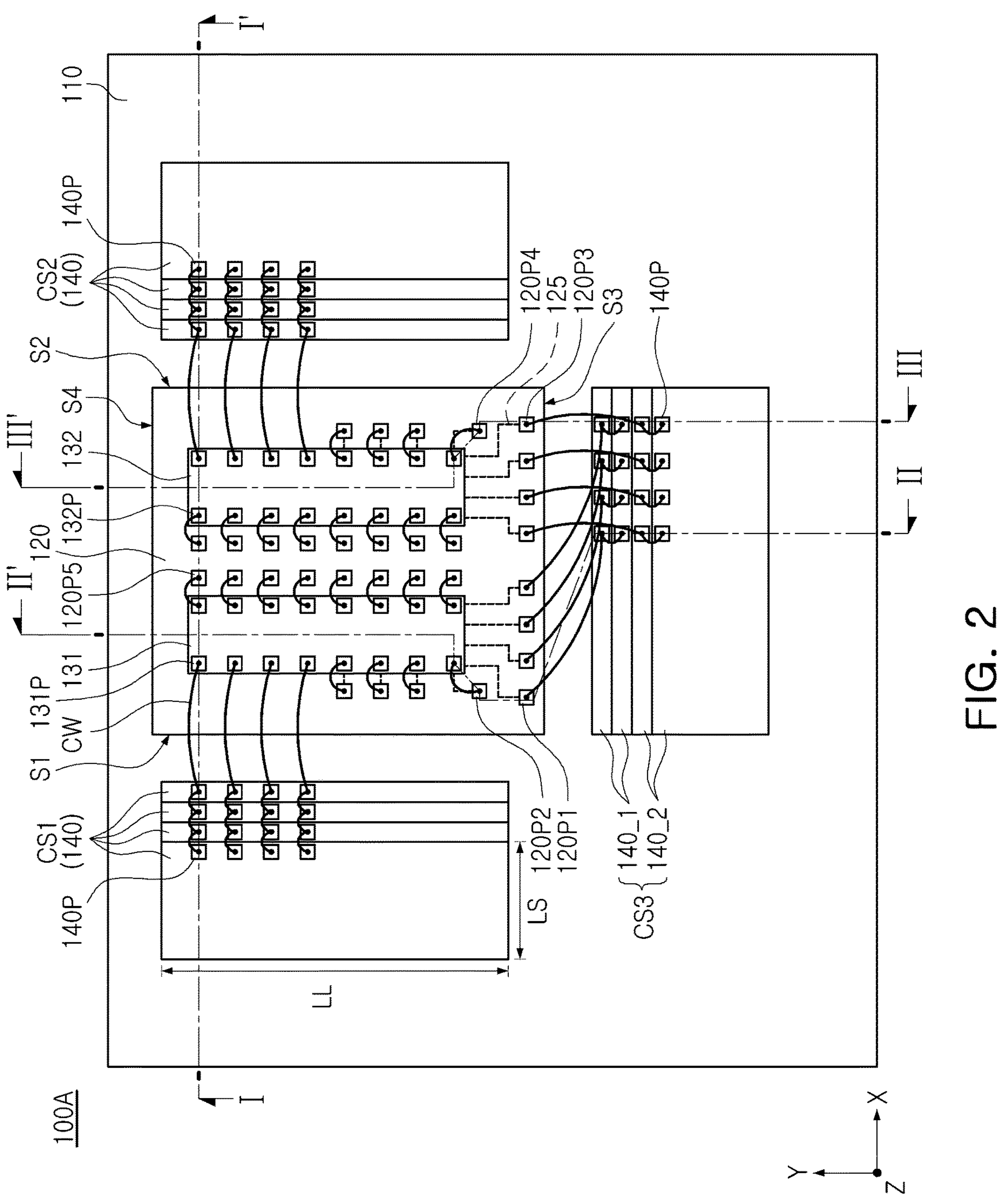
FIG. 2 is a plan view of a semiconductor package according to an example embodiment.
Figure 3A:
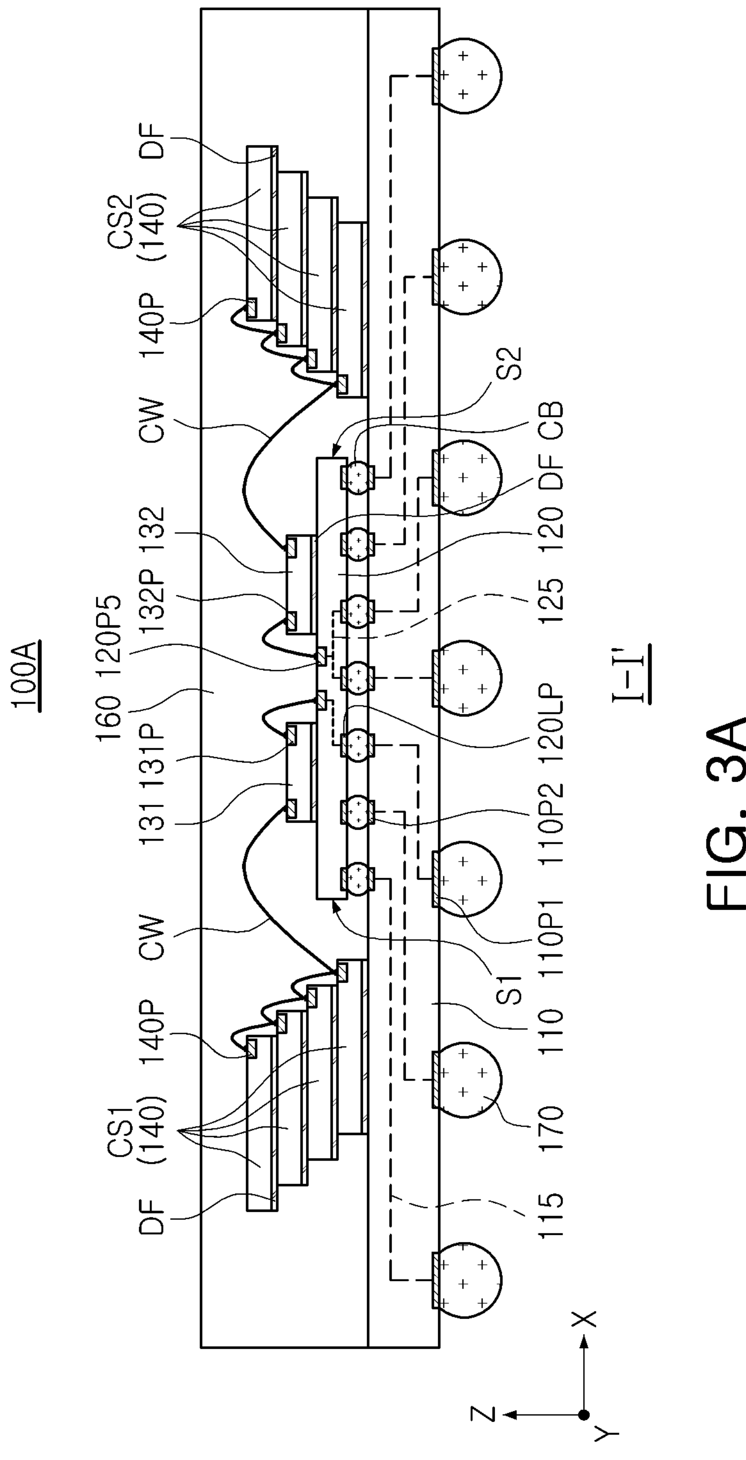
FIG. 3A is a cross-sectional view taken along line I-I' of FIG. 2.
Figure 3B:
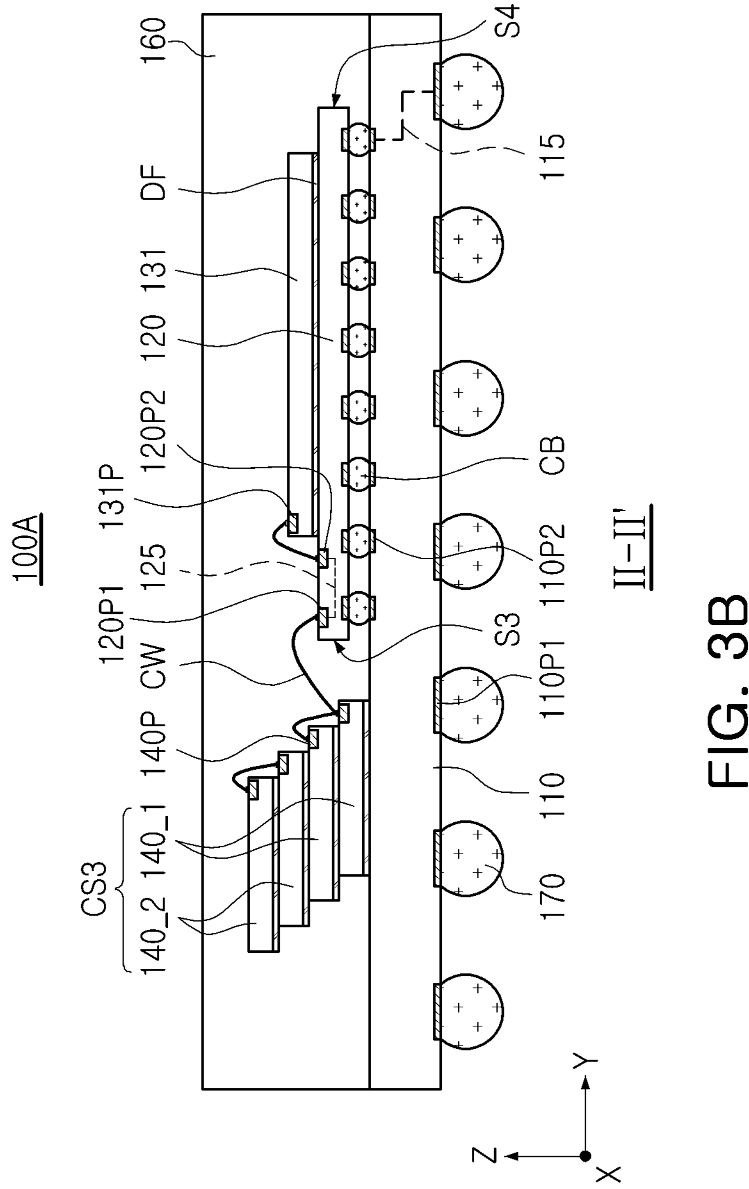
FIG. 3B is a cross-sectional view taken along line II-II' of FIG. 2.
Figure 3C:
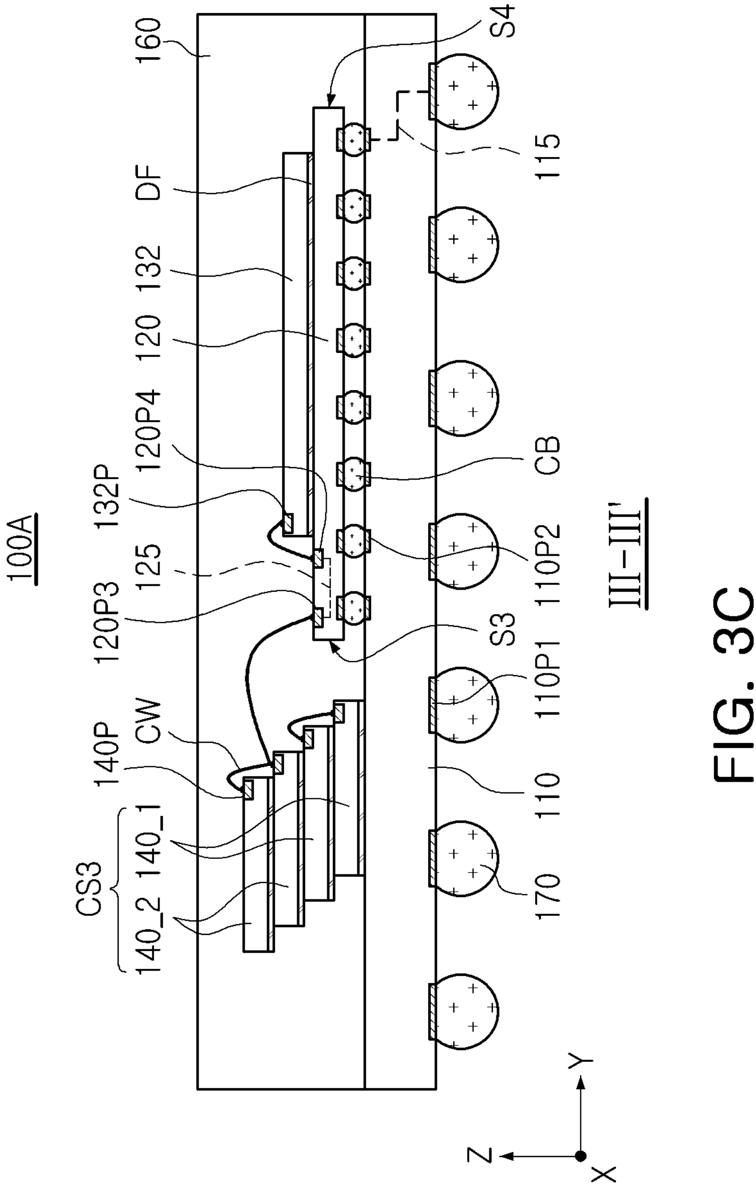
FIG. 3C is a cross-sectional view taken along line III-III' of FIG. 2.

FIG. 2 is a plan view of a semiconductor package 100A according to an example embodiment, FIG. 3A is a cross-sectional view taken along line I-I' of FIG. 2, and FIG. 3B is a cross-sectional view taken along line II-II' of FIG. 2, and FIG. 3C is a cross-sectional view of III-III' of FIG. 2.

Referring to FIGS. 2 to 3C, the semiconductor package 100A according to an example embodiment may include a substrate 110, an interposer 120, buffer chips 131 and 132, and chip stacks CS1, CS2, and CS3. The semiconductor package 100A may further include an encapsulant 160 and connection bumps 170. For example, the chip stacks CS1, CS2, and CS3 may include a first chip stack CS1, a second chip stack CS2, and a third chip stack CS3. For example, the buffer chips 131 and 132 may include a first buffer chip 131 and a second buffer chip 132.

The semiconductor package 100A according to an example embodiment may include chip stacks CS1, CS2, and CS3 disposed on the substrate 110 to be adjacent to the interposer 120. Each of the chip stacks CS1, CS2, and CS3 may include a plurality of semiconductor chips 140 stacked in a vertical direction (a Z-direction). Among the chip stacks CS1, CS2, and CS3, a portion of chip stacks (for example, CS1 and CS2) may be directly (e.g., without the interposer 120 therebetween) and electrically connected to the buffer chips 131 and 132, and the other portion of chip stacks (for example, CS3) may be connected to the buffer chips 131 and 132 via an interconnect circuit 125 of the interposer 120. Therefore, according to an example embodiment, a semiconductor package 100A having an increased response speed of the chip stacks CS1, CS2, and CS3 and a significantly reduced mounting area (or a significantly reduced occupied area) of the substrate 110 while including a large number of chip stacks CS1, CS2, and CS3 (larger than conventional semiconductor package) may be implemented.

Hereinafter, respective components of the semiconductor package 100A will be described in detail.

The substrate 110 may be a substrate for a semiconductor package including a printed circuit board (PCB), a ceramic substrate, a glass substrate, a tape wiring board, or the like. For example, the substrate 110 may be a double-sided PCB or a multilayer PCB. The substrate 110 may include a lower electrode 110P1, an upper electrode 110P2, and a wiring circuit 115 electrically connecting the lower electrode 110P1 and the upper electrode 110P2 to each other. The lower electrode 110P1 and the upper electrode 110P2 may include copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and/or an alloy including two or more metals thereof, but the material for the lower electrode 110P1 and the upper electrode 110P2 may not be limited thereto. Connection bumps 170 may be on (e.g., disposed below) the lower electrode 110P1. The connection bumps 170 may include tin (Sn) or an alloy containing tin (Sn) (for example, Sn—Ag—Cu), but not limited thereto. The connection bumps 170 may be electrically connected to an external device such as a module substrate, a system board, or the like. The connection bumps 170 may be electrically connected to the wiring circuit 115.

The interposer 120 may be disposed on the substrate 110 and may include an interconnect circuit 125 electrically connected to the wiring circuit 115 of the substrate 110. The interposer 120 may include a silicon interposer, but may include another interposer, for example, a redistribution interposer formed using a photosensitive resin.

At least three sides of the interposer 120 may be surrounded by chip stacks CS1, CS2, and CS3 in the plan view. For example, the interposer 120 may have a (e.g., rectangular) shape that comprises a first side S1 and a second side S2, opposing each other, and a third side S3 and a fourth side S4 between the first side S1 and the second side S2. The chip stacks CS1, CS2, and CS3 may be disposed to be adjacent to at least the first side S1, the second side S2, and the third side S3 of the interposer 120, respectively. According to example embodiments, a chip stack or a semiconductor chip may not be disposed between the fourth side S4 of the interposer 120 and a corner of the substrate 110, but example embodiments are not limited thereto.

The interposer 120 may include upper pads (first to fifth upper pads) 120P1, 120P2, 120P3, 120P4, and 120P5 and lower pads 120LP. The upper pads 120P1, 120P2, 120P3, 120P4, and 120P5 may be electrically connected to the chip stacks CS1, CS2, and CS3 and the buffer chips 131 and 132 through a conductive wire CW.

The interposer 120 may include first upper pads 120P1 and third upper pads 120P3, disposed adjacent to a portion of chip stacks (for example, the third chip stack CS3), which may be relatively more difficult to be directly connected to the buffer chips 131 and 132, compared to the other portions of chip stacks (for example, the first and second chip stacks CS1 and CS2), and second upper pads 120P2, fourth upper pads 120P4, and fifth upper pads 120P5 disposed to be adjacent to the buffer chips 131 and 132.

The first upper pads 120P1 may be electrically connected to connection pads 140P of a first group of semiconductor chips 140_1 of the third chip stack CS3 by a conductive wire CW.

The third upper pads 120P3 may be electrically connected to connection pads 140P of a second group of semiconductor chips 140_2 of the third chip stack CS3 by a conductive wire CW.

The first upper pads 120P1 may be electrically connected to the second upper pads 120P2 by the interconnect circuit 125.

The third upper pads 120P3 may be electrically connected to the fourth upper pads 120P4 by the interconnect circuit 125.

The interconnection circuit 125 may substantially redistribute the first upper pads 120P1 and the third upper pads 120P3 to locations adjacent to the buffer chips 131 and 132 (for example, locations corresponding to the second upper pads 120P2 and the fourth upper pads 120P4).

The fifth upper pads 120P5 may be electrically connected to the buffer chips 131 and 132 through a conductive wire CW.

In an example embodiment, the lower pads 120LP may be electrically connected to the fifth upper pads 120P5 by the interconnect circuit 125.

The lower pads 120LP may be electrically connected to the wiring circuit 115 of the substrate 110 through conductive bumps CB. In an example embodiment, the interposer 120 may be electrically connected to the substrate 110 through the conductive bumps CB and may be configured to transmit signals and/or data, received through the buffer chips 131 and 132, to an external entity or to transmit externally received command and address signals to the buffer chips 131 and 132. According to example embodiments, the interposer 120 may not include the lower pads 120LP (an example embodiment of FIGS. 4 to 5C).

The buffer chips 131 and 132 may include the first buffer chip 131 and the second buffer chip 132 spaced apart from each other on the interposer 120. The buffer chips 131 and 132 may be attached to the interposer 120 by an adhesive film DF.

The buffer chips 131 and 132 may be electrically connected to the interposer 120 and a portion of chip stacks (for example, the first chip stack CS1 and the second chip stack CS2) by a conductive wire CW.

The first buffer chip 131 may include first connection terminals 131P electrically connected to the second upper pads 120P2 of the interposer 120 and the connection pads 140P of the first chip stack CS1 by a conductive wire CW.

At least some of the first connection terminals 131P may be electrically connected to the fifth upper pads 120P5 through a conductive wire CW.

The second buffer chip 132 may include second connection terminals 132P electrically connected to the fourth upper pads 120P4 of the interposer 120 and the connection pads 140P of the second chip stack CS2 by a conductive wire CW.

At least some of the second connection terminals 132P may be electrically connected to the fifth upper pads 120P5 through a conductive wire CW.

As described above, some of the chip stacks (for example, the first and second chip stacks CS1 and CS2) may be directly (e.g., without the interposer 120 therebetween) and electrically connected to the buffer chips 131 and 132, and the other chip stack (for example, the third chip stack CS3) may be connected to the buffer chips 131 and 132 via the interposer 120.

Each of the chip stacks CS1, CS2, and CS3 may include semiconductor chips 140 stacked in a vertical direction (a Z-direction). Each of the chip stacks CS1, CS2, and CS3 may include the same number of semiconductor chips 140, but example embodiments are not limited thereto. According to example embodiments, the chip stacks CS1, CS2, and CS3 may include different numbers of semiconductor chips 140 (an example embodiment of FIG. 7).

The semiconductor chips 140 may include a nonvolatile memory chip such as a flash memory, a phase-change random access memory (PRAM), a magnetic random access memory (MRAM), a ferroelectric random access memory (FeRAM), or a resistive random access memory (RRAM) and/or a volatile memory chip such as a dynamic random access memory (DRAM) or a static random access memory (SRAM). According to example embodiments, semiconductor chips 140_1 and 140_2 (e.g., first and second groups of semiconductor chips 140_1 and 140_2) of the third chip stack CS3 may be memory chips having capacity, different from capacity of the semiconductor chips 140 of the first and second chip stacks CS1 and CS2. For example, the semiconductor chips 140_1 and 140_2 of the third chip stack CS3 may include a memory chip having capacity, higher than capacity of the semiconductor chips 140 of the first chip stack CS1 and the second chip stack CS2. The type of semiconductor chips 140_1 and 140_2 may be the same as the type the semiconductor chips 140 described above (e.g., flash memory, PRAM, MRAM, FeRAM, RRAM, DRAM, and/or SRAM).

Each of the semiconductor chips 140 may include connection pads 140P. The connection pads 140P may include signal pads and power/ground pads. In the drawing, the plurality of semiconductor chips 140 are illustrated as being offset in the vertical direction (the Z-direction) to expose the connection pads 140P, but example embodiments are not limited thereto. The plurality of semiconductor chips 140 may be attached to the substrate 110 or attached to each other by an adhesive film DF.

The plurality of semiconductor chips 140 may have a long side, facing (opposing) the interposer 120, and a short side extending from one end of the long side. The long side and the short side of the semiconductor chips 140 may be formed at a predetermined ratio such that the chip stacks CS1, CS2, and CS3 are disposed on at least three surfaces of the interposer 120. In the semiconductor chips 140, a ratio of a length LL of the long side to a length SL of the short side may be about 2.5 or less, for example, within a range of about 1 to about 2.5, a range of about 1 to about 2.3, a range of about 1.2 to about 2.3, or a range of about 1.4 to about 2.3, but example embodiments are not limited thereto. According to example embodiments, the semiconductor chips 140_1 and 140_2 of the third chip stack CS3 may have sizes, different from those of the semiconductor chips 140 of the first and second chip stack CS1 and CS2. For example, in the semiconductor chips 140_1 and 140_2 of the third chip stack CS3, a ratio of a length LL of a long side to a length SL of a short side may be about 1.5 or more, and in the semiconductor chips 140 of the first chip stack SC1 and the second chip stack CS2, a ratio of a length LL of a long side to a length SL of a short side may be about 1.5 or less.

According to the present disclosure, the chip stacks CS1, CS2, and CS3 may be disposed on at least three sides of the interposer 120, and a portion of chip stacks (for example, the third chip stack CS3), disposed in a location in which it may be more difficult than the other portions of chip stacks (for example, the first and second chip stacks CS1 and CS2) to directly connect the chip stack to the buffer chips 131 and 132 on the interposer 120, may be connected to the buffer chips 131 and 132 via the interposer 120 to embed a larger number of chip stacks CS1, CS2, and CS3 in the semiconductor package 100A and to increase a response speed of the chip stacks CS1, CS2, and CS3. For example, the chip stacks CS1, CS2, and CS3 may include a first chip stack CS1, a second chip stack CS2, and a third chip stack CS3, respectively disposed to be adjacent to the first side S1, the second side S2, and the third side S3 of the interposer 120.

The first chip stack CS1 may be disposed on the substrate 110 to be adjacent to the first side S1 of the interposer 120 and may be electrically connected to the first buffer chip 131. The semiconductor chips 140 of the first chip stack CS1 may be directly and electrically connected (e.g., without connection to the interconnect circuit 125 of the interposer 120) to the first connection terminals 131P of the first buffer chip 131 by a conductive wire CW.

The second chip stack CS2 may be disposed on the substrate 110 to be adjacent to the second side S2 of the interposer 120 and may be electrically connected to the second buffer chip 132. The semiconductor chips 140 of the second chip stack CS2 may be directly and electrically connected (e.g., without connection to the interconnect circuit 125 of the interposer 120) to the second connection terminals 132P of the second buffer chip 132 by a conductive wire CW.

The third chip stack CS3 may be disposed on the substrate 110 to be adjacent to the third side S3 of the interposer 120 and may be electrically connected to the interposer 120, the first buffer chip 131, and the second buffer chip 132.

The third chip stack CS3 may include a first group of semiconductor chips 140_1, electrically connected to the first buffer chip 131 via the interconnect circuit 125 of the interposer 120, and a second group of semiconductor chips 140_2 electrically connected to the second buffer chip 132 via the interconnect circuit 125. The first group of semiconductor chips 140_1 and the second group of semiconductor chips 140_2 may be stacked in the vertical direction (the Z-direction), perpendicular to the upper surface of the substrate 110.

The first group of semiconductor chips 140_1 and the second group of semiconductor chips 140_2 of the third chip stack CS3 may be electrically insulated from each other, in terms of a signal path. The first group of semiconductor chips 140_1 may form one or more channels together with the first chip stack CS1, and the second group of semiconductor chips 140_2 may form one or more channels together with the second chip stack CS2. For example, the first group of semiconductor chips 140_1 and the second group of semiconductor chips 140_2 may be connected to the first buffer chip 131 and the second buffer chip 132 to form different channels.

The first group of semiconductor chips 140_1 and the second group of semiconductor chips 140_2 may have the same capacity. For example, the number of the first group of semiconductor chips 140_1 may be the same as the number of the second group of semiconductor chips 140_2, but example embodiments are not limited thereto. According to example embodiments, the number of the first group of semiconductor chips 140_1 may be different from the number of the second group of semiconductor chips 140_2.

When the chip stacks CS1, CS2, and CS3 include the same number of semiconductor chips 140, the number of the first group of semiconductor chips 140_1 may be smaller than the number of semiconductor chips 140 of the first chip stack CS1 and the number of the second group of semiconductor chips 140_2 may be smaller than the number of semiconductor chips 140 of the second chip stack CS2.

In some embodiments, a chip stack or semiconductor chip may not be disposed between the fourth side S4 of the interposer 120 and the (closest) edge of the substrate 110 facing the fourth side S4, but example embodiments are not limited thereto.

The encapsulant 160 may be on (may encapsulate) the interposer 120, the first chip stack CS1, the second chip stack CS2, and the third chip stack CS3 on the substrate 110. The encapsulant 160 may be a thermosetting resin such as epoxy resin, a thermoplastic resin such as polyimide, or a resin impregnated with an inorganic filler in these resins, for example, prepreg, an Ajinomoto Build-up Film (ABF), FR-4, Bismaleimide Triazine (BT), or an epoxy molding compound (EMC).

Figure 4:
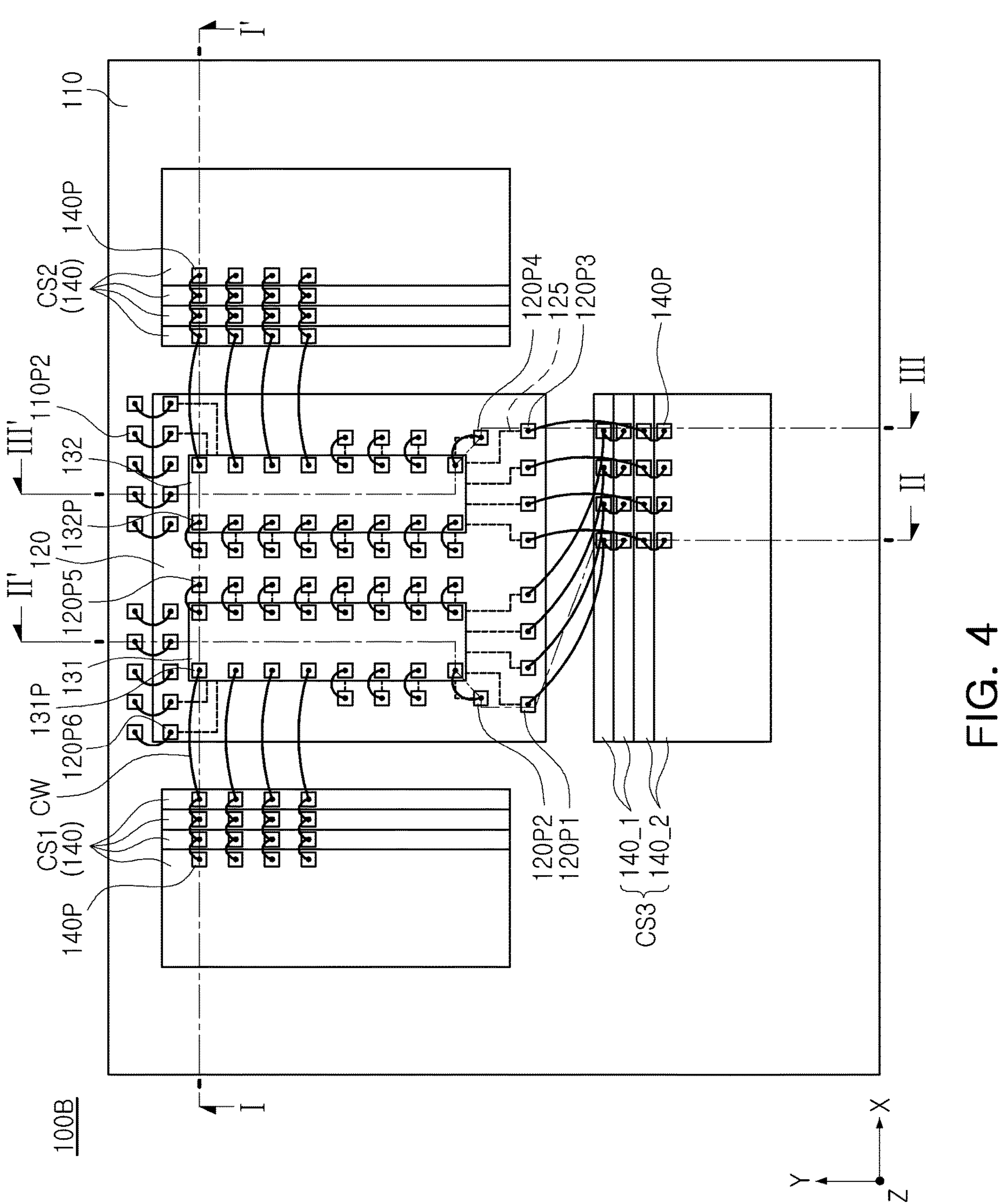
FIG. 4 is a plan view of a semiconductor package according to an example embodiment.
Figure 5A:
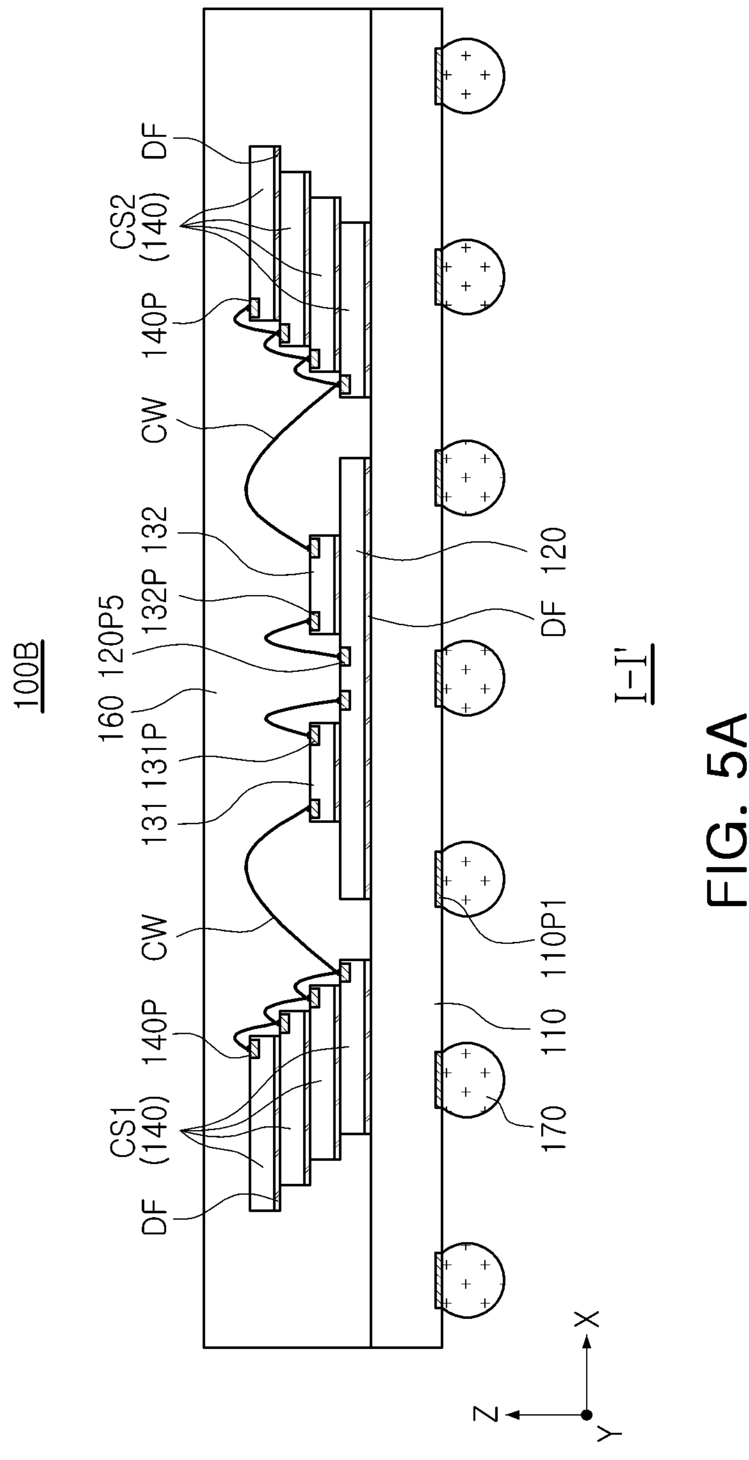
FIG. 5A is a cross-sectional view taken along line I-I' of FIG. 4.
Figure 5B:
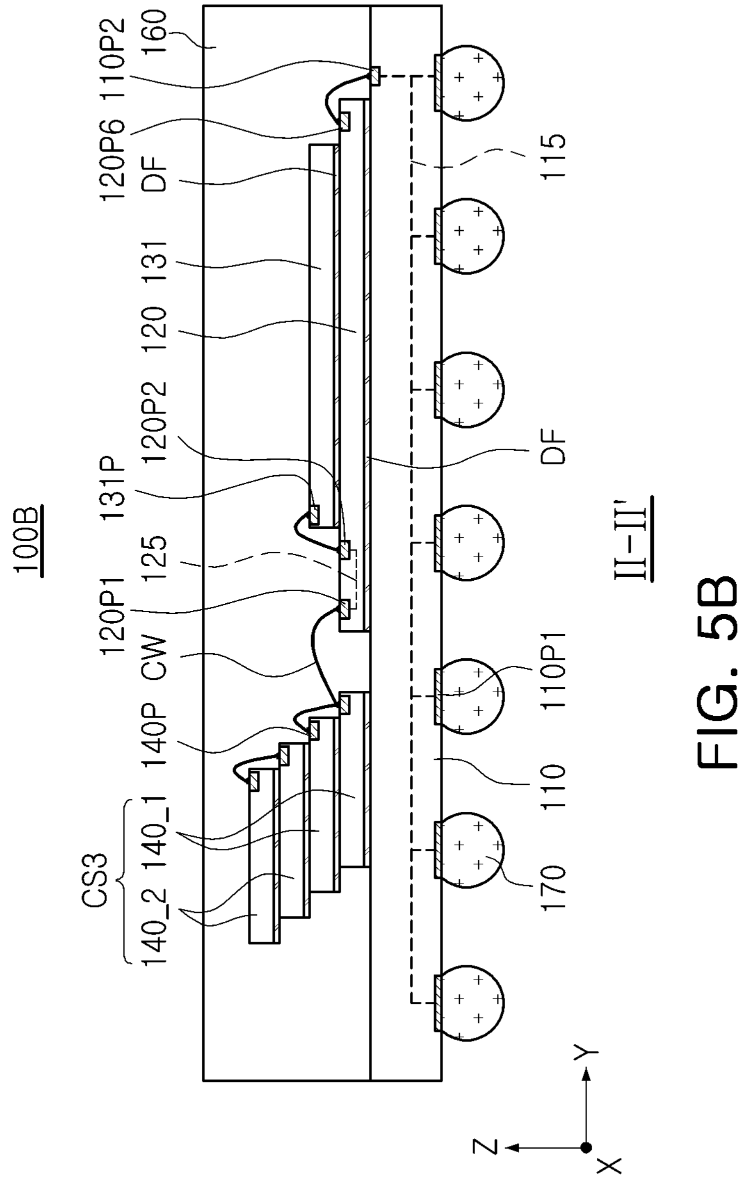
FIG. 5B is a cross-sectional view taken along line II-II' of FIG. 4.
Figure 5C:
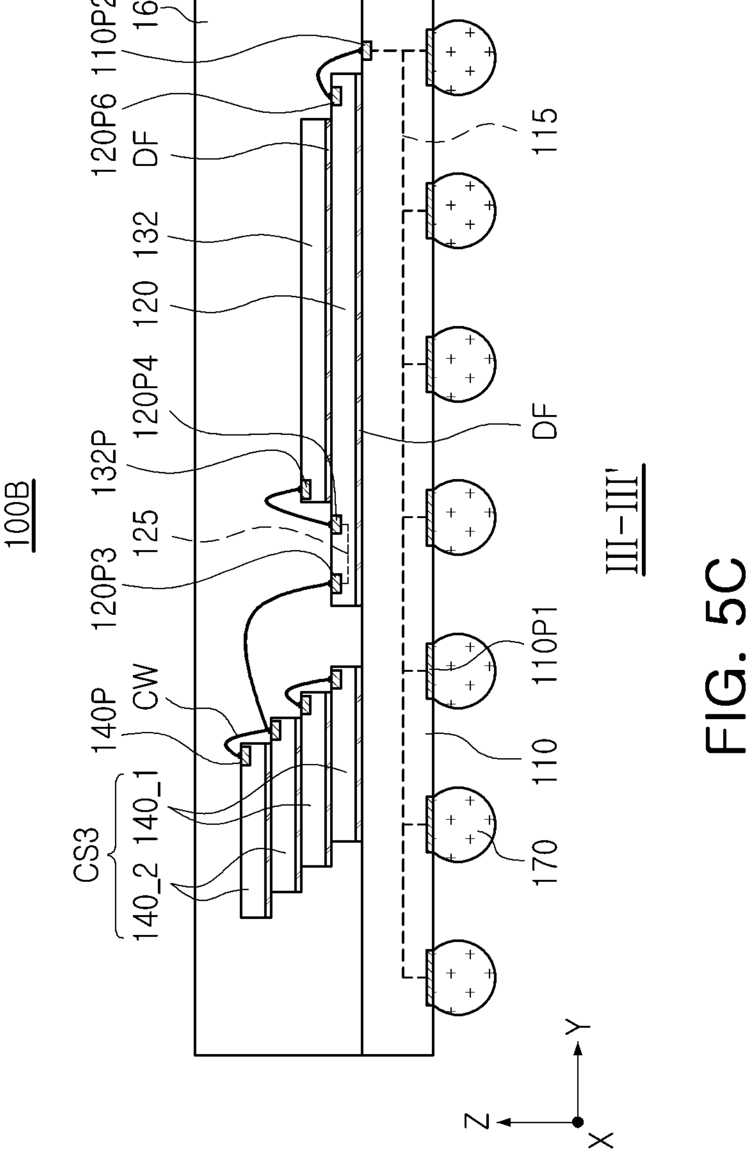
FIG. 5C is a cross-sectional view taken along line III-III' of FIG. 4.

FIG. 4 is a plan view of a semiconductor package 100B according to an example embodiment, FIG. 5A is a cross-sectional view taken along line I-I' of FIG. 4, and FIG. 5B is a cross-sectional view taken along line II-II' of FIG. 4, and FIG. 5C is a cross-sectional view taken along line III-III' of FIG. 4.

Referring to FIGS. 4 to 5C, the semiconductor package 100B according to an example embodiment may have features the same as or similar to those described with reference to FIGS. 1A to 3C, except that an interposer 120 is connected to a substrate 110 by a conductive wire CW.

In the present embodiment, the interposer 120 may further include sixth upper pads 120P6 disposed to be adjacent to upper electrodes 110P2 of the substrate 110. The interposer 120 may be electrically connected to the substrate 110 through the upper electrodes 110P2 and may be configured to transmit signals and/or data, received through buffer chips 131 and 132, to an external entity or to transmit externally received command or address signals to the buffer chips 131 and 132. The interposer 120 may be attached to the substrate 110 by an adhesive film DF.

The sixth upper pads 120P6 may be electrically connected to the upper electrodes 110P2 of the substrate 110 and a wiring circuit 115 by conductive wires CW. The sixth upper pads 120P6 may be electrically connected to fifth upper pads 120P5 by an interconnect circuit 125. The interconnect circuit 125 may substantially redistribute the fifth upper pads 120P5 to locations adjacent to the upper electrodes 110P2 of the substrate 110.

Figure 6A:
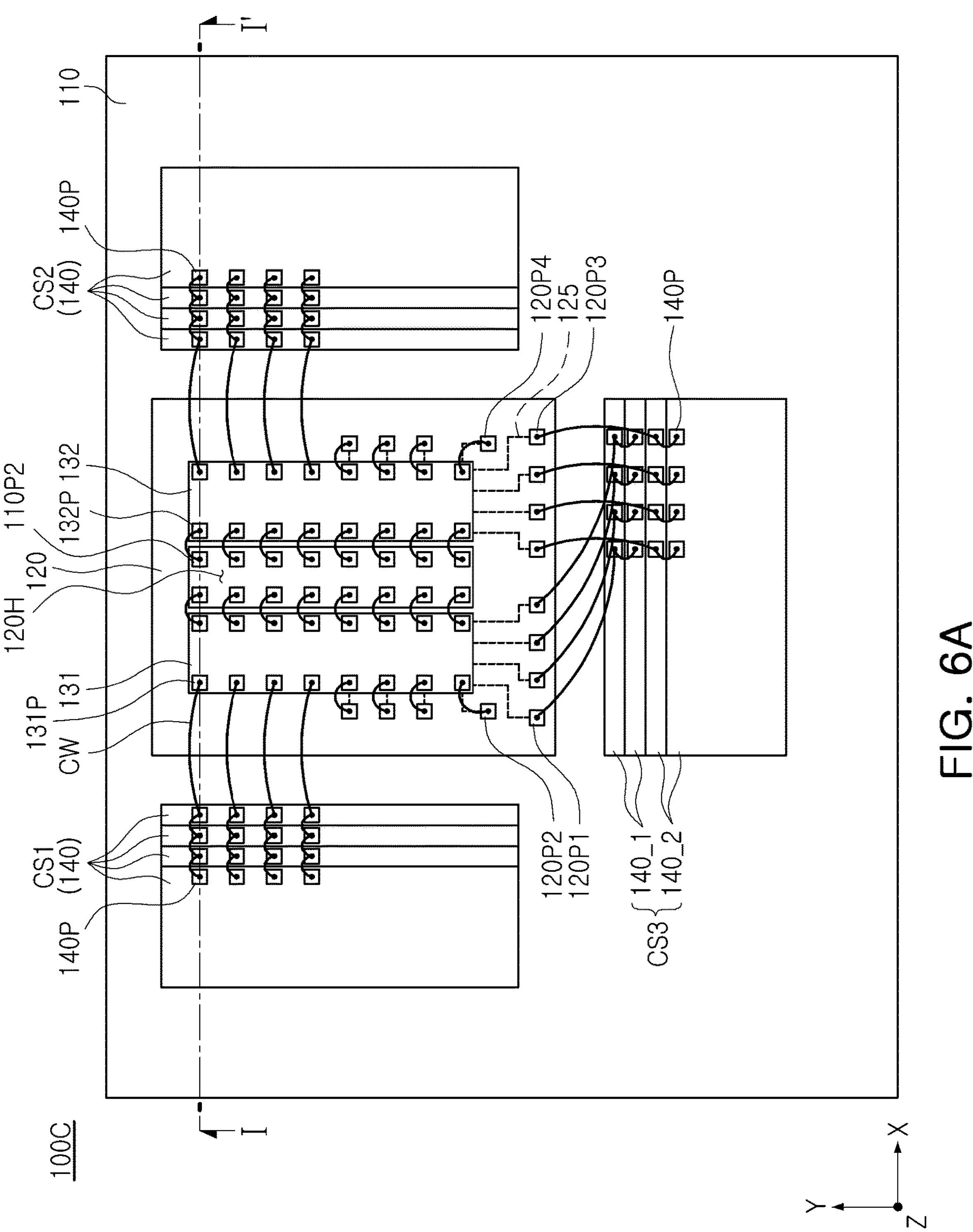
FIG. 6A is a plan view of a semiconductor package according to an example embodiment.
Figure 6B:
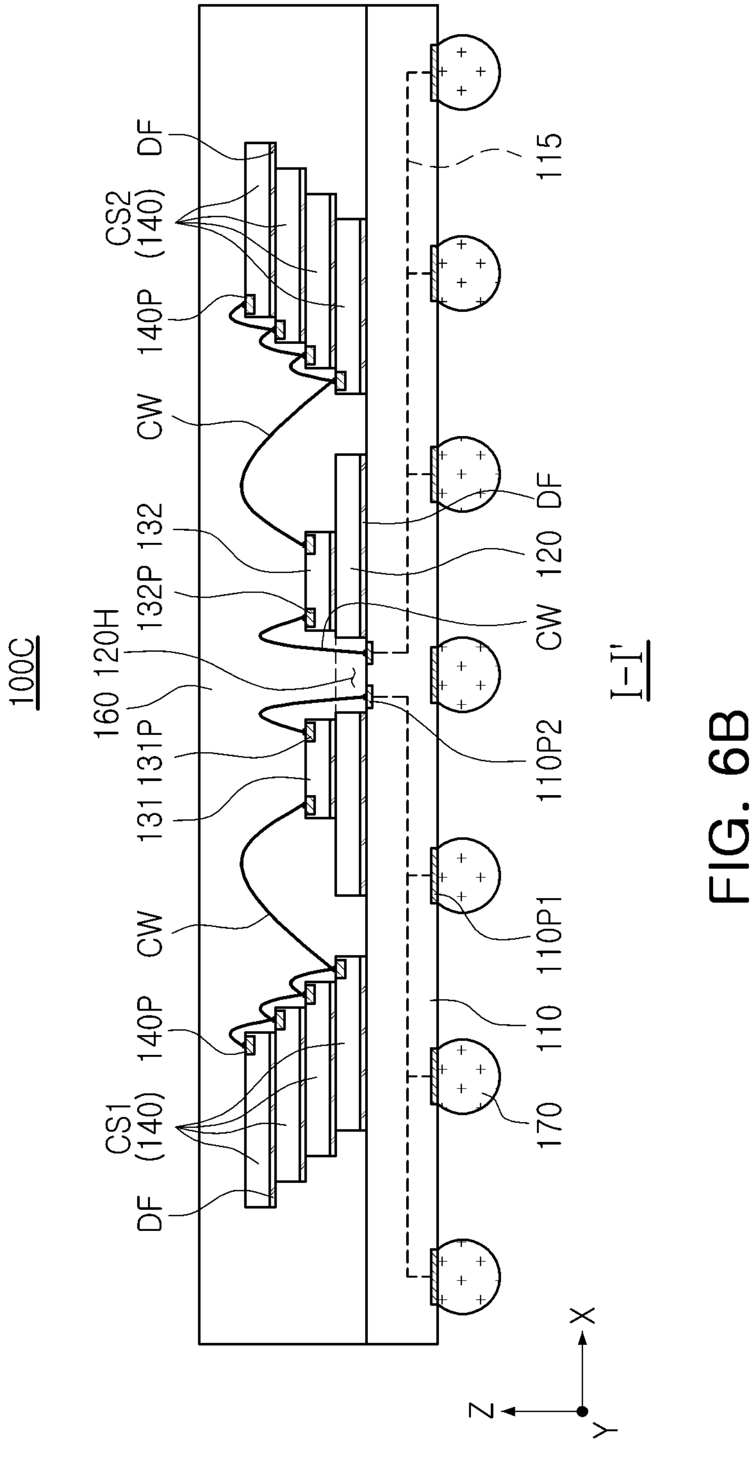
FIG. 6B is a cross-sectional view taken along line I-I' of FIG. 6A.

FIG. 6A is a plan view of a semiconductor package 100C to an example embodiment, and FIG. 6B is a cross-sectional view taken along line I-I' of FIG. 6A.

Referring to FIGS. 6A and 6B, the semiconductor package 100C according to an example embodiment may have features the same as or similar to those described with reference to FIGS. 1A to 5C, except that buffer chips 131 and 132 are directly and electrically connected to a substrate 110.

The interposer 120 may have a slot 120H overlapping (exposing) at least a subset of upper electrodes 110P2 of the substrate 110 in a vertical direction (a Z-direction). The slot 120H may be a hollow (e.g., an opening) exposing the subset of upper electrodes 110P2 through the interposer 120. A first buffer chip 131 (e.g., a first connection terminal 131P in the first buffer chip 131) and a second buffer chip 132 (e.g., a second connection terminal 132P in the second buffer chip 132) may be connected to the subset of upper electrodes 110P2 of the substrate 110 by conductive wires CW passing through the slot 120H, respectively. An electrical connection path between the interposer 120 and the substrate 110 is not illustrated in the drawings, but in some embodiments, the interposer 120 may be electrically connected to the substrate 110 through conductive bump CB or a conductive wire CW.

Figure 7:
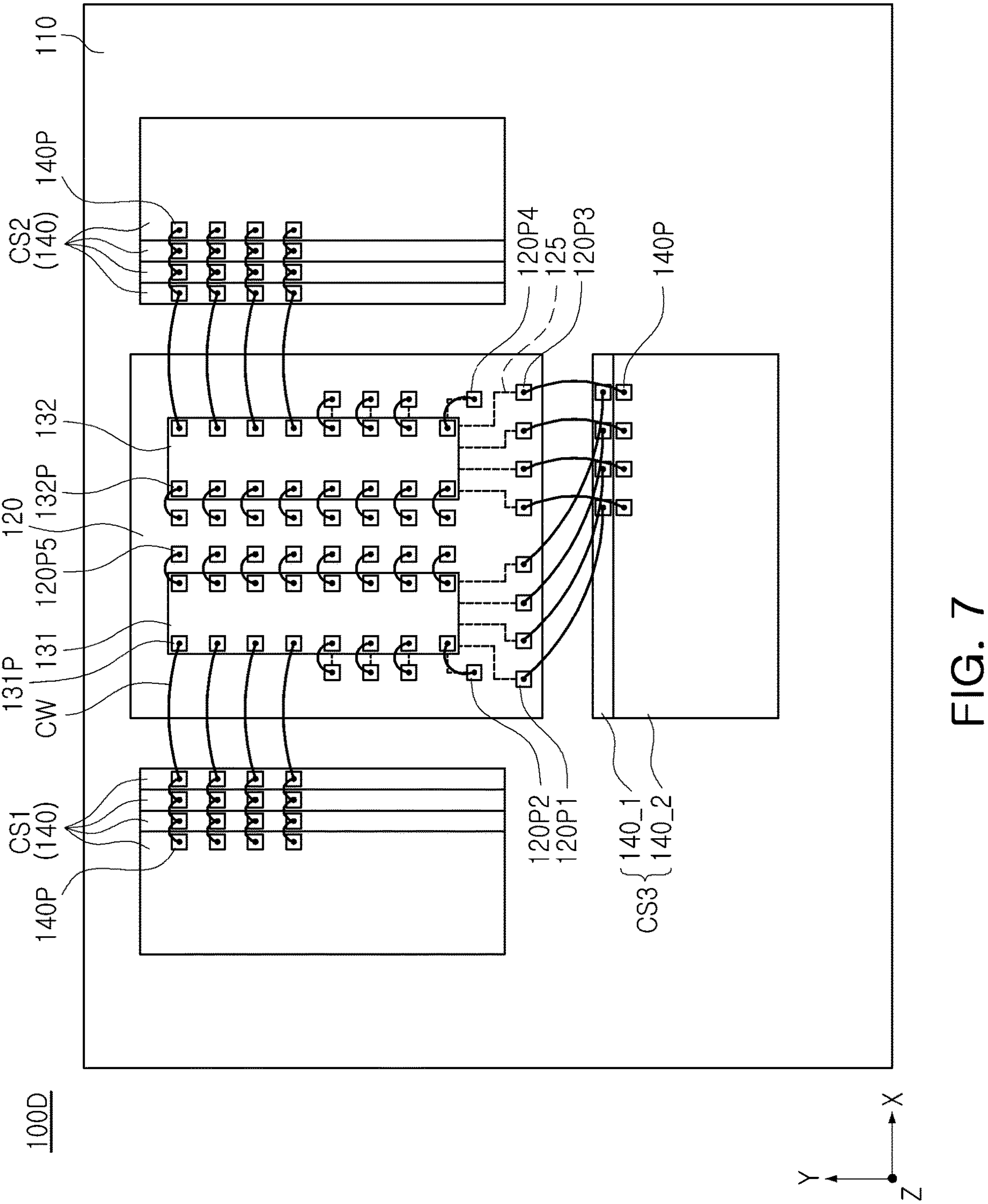
FIG. 7 is a plan view of a semiconductor package according to an example embodiment.

FIG. 7 is a plan view of a semiconductor package 100D according to an example embodiment.

Referring to FIG. 7, a semiconductor package 100D according to an exemplary embodiment may have features the same as or similar to those described with reference to FIGS. 1A to 6B, except that the numbers of semiconductor chips 140 of chip stacks CS1, CS2, and CS3 are different from each other.

In the present embodiment, the third chip stack CS3 may include fewer semiconductor chips 140_1 and 140_2 than the semiconductor chips 140 of the first and second chip stacks CS1 and CS1. For example, when each of the first chip stack CS1 and the second chip stack CS2 includes 4 or 8 semiconductor chips, the third chip stack CS3 may include 2 or 4 semiconductor chips.

In some embodiments, semiconductor chips 140_1 and 140_2 of the third chip stack CS3 may include memory chips having higher capacity than the semiconductor chips 140 of the first and second chip stacks CS1 and CS1, but example embodiments are not limited thereto.

Figure 8:
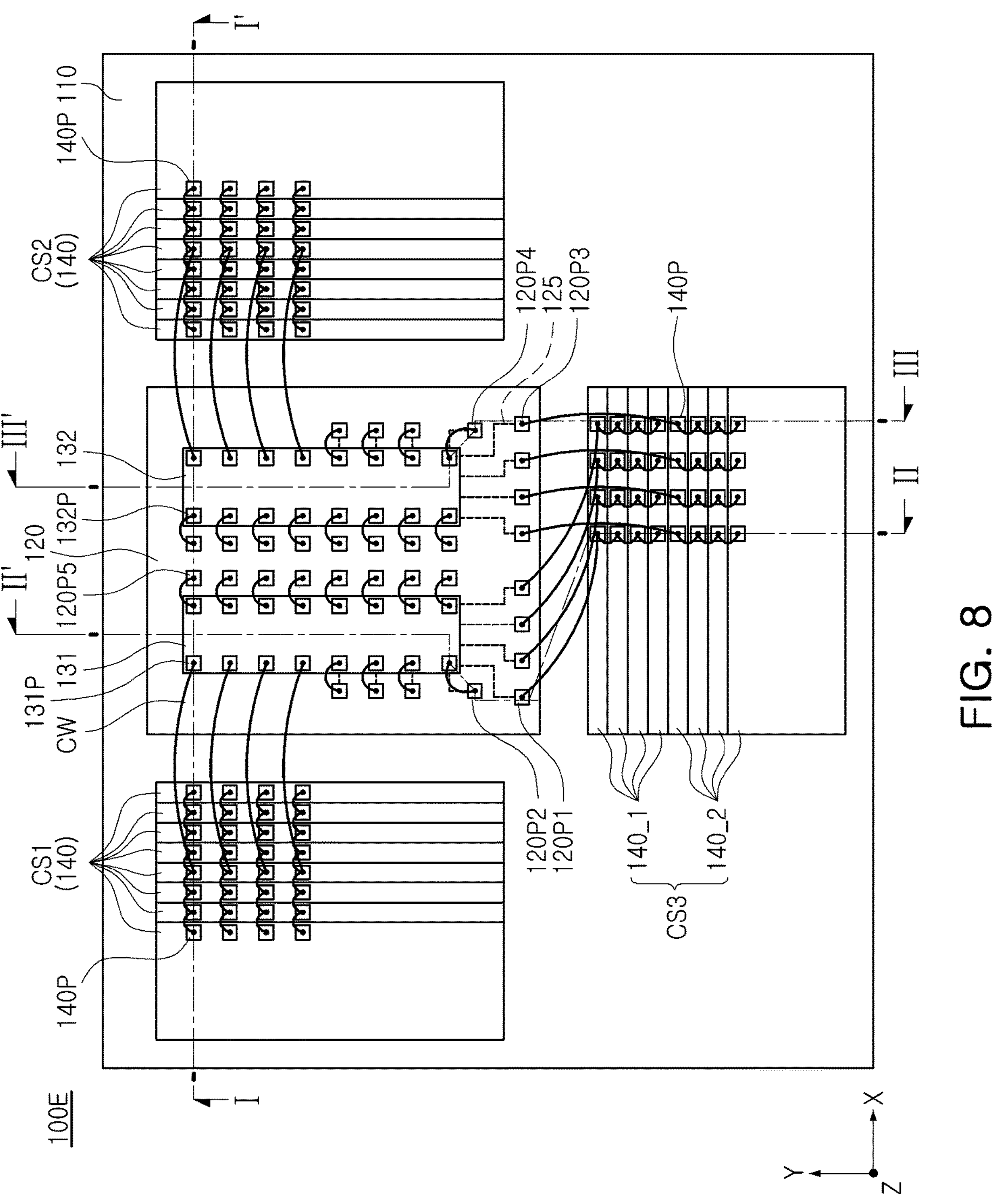
FIG. 8 is a plan view of a semiconductor package according to an example embodiment.
Figure 9A:
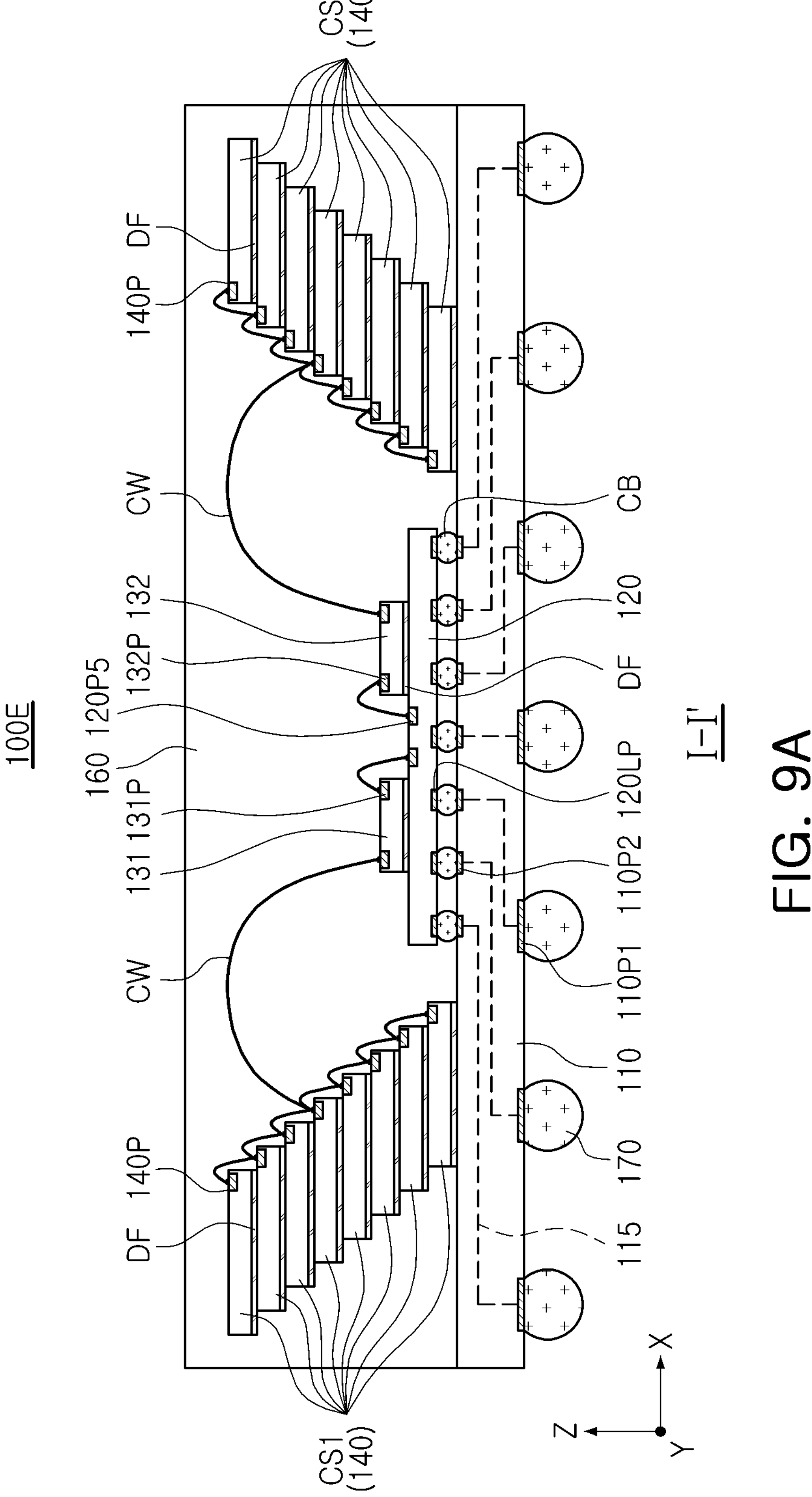
FIG. 9A is a cross-sectional view taken along line I-I' of FIG. 8.
Figure 9B:
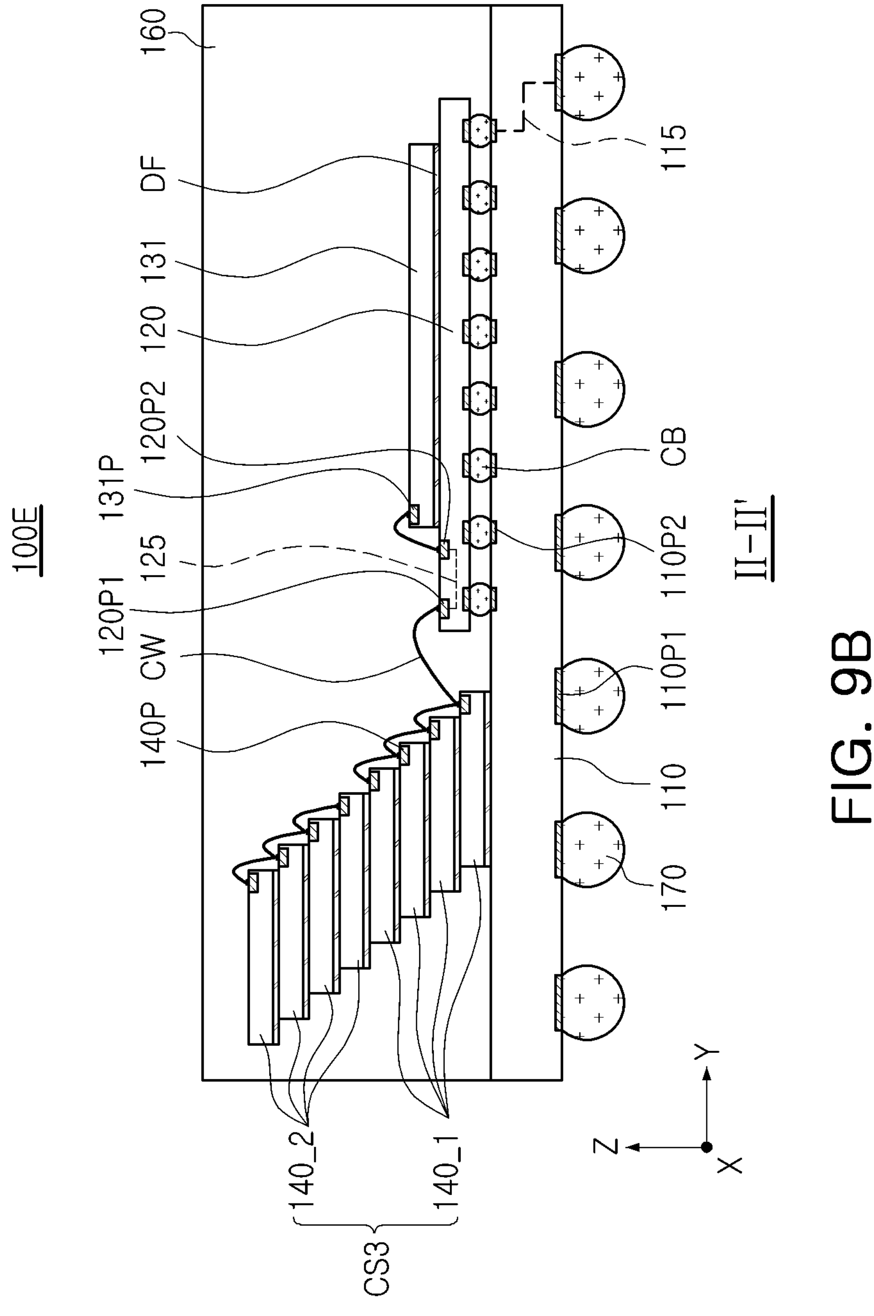
FIG. 9B is a cross-sectional view taken along line II-II' of FIG. 8.
Figure 9C:
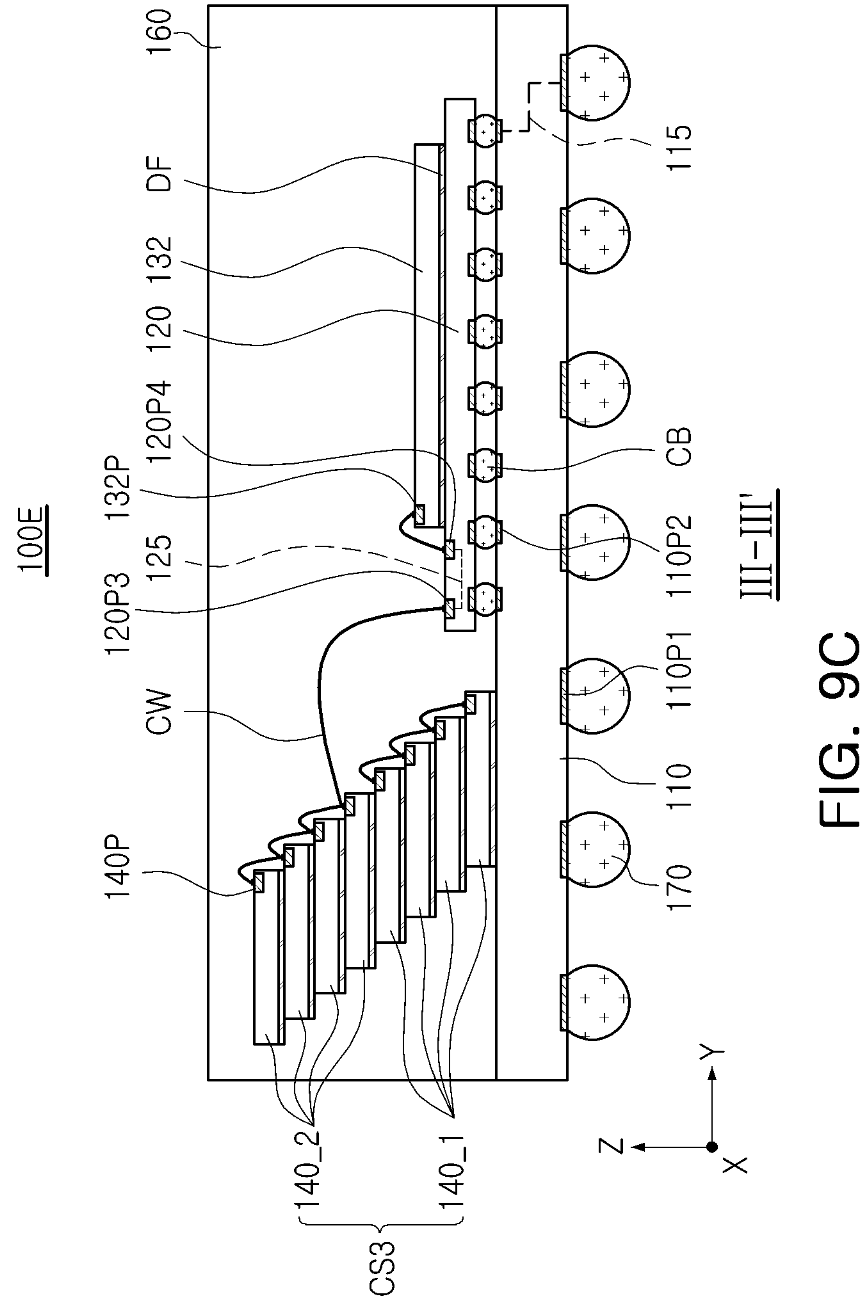
FIG. 9C is a cross-sectional view taken along line III-III' of FIG. 8.

FIG. 8 is a plan view of a semiconductor package 100E according to an example embodiment, FIG. 9A is a cross-sectional view taken along line I-I' of FIG. 8, FIG. 9B is a cross-sectional view taken along line II-II' of FIG. 8, and FIG. 9C is a cross-sectional view taken along III-III' line of FIG. 8.

Referring to FIGS. 8 to 9C, the semiconductor package 100E according to an example embodiment may have features the same as or similar to those described with reference to FIGS. 1A to 7, except that the semiconductor package 100E includes more semiconductor chips 140 than those in the example embodiments of FIGS. 3 to 7. Each of first and second groups of semiconductor chips 140_1 and 140_2 may be more than those in the example embodiments of FIGS. 3 to 7.

Chip stacks CS1, CS2, and CS3 may each include five or more semiconductor chips 140. For example, each of the first chip stack CS1, the second chip stack CS2, and the third chip stack CS3 may include eight semiconductor chips 140. Each of the first group of semiconductor chips 140_1 and the second group of semiconductor chips 140_2 may include four semiconductor chips.

In some embodiments, the semiconductor chips 140 of the first chip stack CS1 and the first group of semiconductor chips 140_1 of the third chip stack CS3 may form two or more channels. In this case, as illustrated in the drawing, connection pads 140P of the semiconductor chips 140 of the first chip stack CS1 may not be all connected to the first buffer chip 131 (first connection terminals 131P), and connection pads 140P of the semiconductor chips 140, belonging to the same channel, may be connected to each other. Similarly, the semiconductor chips 140 of the second chip stack CS2 and the second group of semiconductor chips 140_2 of the third chip stack CS3 may form two or more channels. In this case, as illustrated in the drawing, connection pads 140P of the semiconductor chips 140 of the second chip stack CS2 may not be all connected to the second buffer chip 132 (second connection terminals 132P), and connection pads 140P of the semiconductor chips 140, belonging to the same channel, may be connected to each other.

According to the present disclosure, the semiconductor chips 140_1 and 140_2 of the third chip stack CS3, disposed in a location in which it is difficult to directly connect the semiconductor chips to the buffer chips 131 and 132 on the interposer 120, may be connected to buffer chips 131 and 132 via an interposer 120. As a result, a semiconductor package 100E including more chip stacks CS1, CS2, and CS3 without a decrease in response speed may be implemented.

As described above, an interposer may be introduced to connect some semiconductor chips, among a plurality of semiconductor chips, to a buffer chip. Accordingly, a semiconductor package including a plurality of semiconductor chips and having an increased response speed may be provided.

Herein, a lower side, a lower portion, a lower surface, and the like, are used to refer to a direction in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer (e.g., adhesive layer) as well as a direct connection (e.g., with/without intervening components) between two components. In addition, "electrically connected" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a substrate that includes a wiring circuit;

an interposer on the substrate, wherein the interposer includes a first side and a second side opposing each other and a third side and a fourth side between the first side and the second side, and wherein the interposer includes an interconnect circuit electrically connected to the wiring circuit;

a first buffer chip on the interposer;

a second buffer chip on the interposer, wherein the second buffer chip is spaced apart from the first buffer chip;

a first chip stack on the substrate, wherein the first chip stack is adjacent to the first side of the interposer and electrically connected to the first buffer chip;

a second chip stack on the substrate, wherein the second chip stack is adjacent to the second side of the interposer and electrically connected to the second buffer chip;

a third chip stack on the substrate, wherein the third chip stack is adjacent to the third side of the interposer, and wherein the third chip stack includes a first group of semiconductor chips, which is electrically connected to the first buffer chip via the interconnect circuit of the interposer, and a second group of semiconductor chips, which is electrically connected to the second buffer chip via the interconnect circuit of the interposer;

an encapsulant on the interposer, the first chip stack, the second chip stack, and the third chip stack; and connection bumps on the substrate and electrically connected to the wiring circuit.

2. The semiconductor package of claim 1, wherein each of the first group of semiconductor chips and the second group of semiconductor chips includes connection pads, wherein the interposer includes first upper pads electrically connected to the connection pads of the first group of semiconductor chips by a first conductive wire, wherein the interposer includes second upper pads electrically connected to the first upper pads by the interconnect circuit, wherein the interposer includes third upper pads electrically connected to the connection pads of the second group of semiconductor chips by a second conductive wire, and wherein the interposer includes fourth upper pads electrically connected to the third upper pads by the interconnect circuit.

3. The semiconductor package of claim 2, wherein the first buffer chip includes first connection terminals electrically connected to the second upper pads by a third conductive wire, and wherein the second buffer chip includes second connection terminals electrically connected to the fourth upper pads by a fourth conductive wire.

4. The semiconductor package of claim 1, wherein the first group of semiconductor chips and the second group of semiconductor chips are stacked in a direction, perpendicular to an upper surface of the substrate.

5. The semiconductor package of claim 1, wherein the first group of semiconductor chips are electrically insulated from the second group of semiconductor chips.

6. The semiconductor package of claim 1, wherein a number of the first group of semiconductor chips is same as a number of the second group of semiconductor chips.

7. The semiconductor package of claim 1, wherein each of the first chip stack and the second chip stack comprises semiconductor chips, wherein a number of the first group of semiconductor chips is smaller than a number of the semiconductor chips of the first chip stack, and wherein a number of the second group of semiconductor chips is smaller than a number of the semiconductor chips of the second chip stack.

8. The semiconductor package of claim 1, wherein the interposer includes fifth upper pads that are electrically connected to the first buffer chip and the second buffer chip, and lower pads that are electrically connected to the fifth upper pads by the interconnect circuit, and wherein the lower pads are electrically connected to the wiring circuit of the substrate through conductive bumps.

9. The semiconductor package of claim 1, wherein the interposer includes fifth upper pads that are electrically connected to the first buffer chip and the second buffer chip, and sixth upper pads that are electrically connected to the fifth upper pads by the interconnect circuit, and wherein the sixth upper pads are electrically connected to the wiring circuit of the substrate through a conductive wire.

10. The semiconductor package of claim 1, wherein the substrate includes upper electrodes, wherein the interposer has a slot that exposes at least a subset of the upper electrodes, wherein the first buffer chip includes first connection terminals, wherein the second buffer chip includes second connection terminals, and wherein the first connection terminals and the second connection terminals are connected to the subset of the upper electrodes by a conductive wire that passes through the slot.

11. The semiconductor package of claim 1, wherein the first buffer chip includes first connection terminals, wherein the second buffer chip includes second connection terminals, wherein each of the first chip stack and the second chip stack includes a plurality of semiconductor chips stacked vertically, wherein the plurality of semiconductor chips of the first chip stack are directly, electrically connected to the first connection terminals by a first conductive wire, and wherein the plurality of semiconductor chips of the second chip stack are directly, electrically connected to the second connection terminals by a second conductive wire.

12. The semiconductor package of claim 1, wherein each of the first chip stack and the second chip stack includes a plurality of semiconductor chips, and wherein the plurality of semiconductor chips has a long side, facing the interposer, and a short side extending from one end of the long side.

13. The semiconductor package of claim 12, wherein a ratio of a length of the long side to a length of the short side is about 2 or less.

14. The semiconductor package of claim 1, wherein the substrate includes an edge facing the fourth side of the interposer, and wherein a semiconductor chip is not disposed between the fourth side of the interposer and the edge of the substrate.

15. A semiconductor package comprising:

a substrate;

an interposer on the substrate;

a first buffer chip on the interposer;

a second buffer chip on the interposer, wherein the second buffer chip is spaced apart from the first buffer chip;

a first chip stack on the substrate, wherein the first chip stack is adjacent to a first side of the interposer and directly, electrically connected to the first buffer chip by a first conductive wire;

a second chip stack on the substrate, wherein the second chip stack is adjacent to a second side of the interposer and directly, electrically connected to the second buffer chip by a second conductive wire; and a third chip stack on the substrate, wherein the third chip stack is adjacent to a third side of the interposer and electrically connected to the interposer, the first buffer chip, and the second buffer chip by a plurality of third conductive wires.

16. The semiconductor package of claim 15, wherein the third chip stack includes a first group of semiconductor chips that is electrically connected to the first buffer chip via the interposer, and a second group of semiconductor chips that is electrically connected to the second buffer chip via the interposer.

17. The semiconductor package of claim 15, wherein the first chip stack, the second chip stack, and the third chip stack include a same number of semiconductor chips.

18. A semiconductor package comprising:

a substrate that includes a wiring circuit;

an interposer on the substrate, wherein the interposer includes an interconnect circuit that is electrically connected to the wiring circuit;

a first buffer chip on the interposer;

a second buffer chip on the interposer, wherein the second buffer chip is spaced apart from the first buffer chip; and chip stacks on the substrate, wherein the chip stacks are horizontally adjacent to the interposer, wherein each of the chip stacks includes a plurality of semiconductor chips stacked vertically, a first subset of chip stacks, among the chip stacks is directly, electrically connected to the first buffer chip and/or the second buffer chip, and a second subset of chip stacks, among the chip stacks is electrically connected to the first buffer chip and/or the second buffer chip via the interconnect circuit.

19. The semiconductor package of claim 18, wherein the second subset of chip stacks includes a first group of semiconductor chips, electrically connected to the first buffer chip, and a second group of semiconductor chips electrically connected to the second buffer chip.

20. The semiconductor package of claim 18, wherein each of the plurality of semiconductor chips has a long side that faces the interposer, and a short side that extends from one end of the long side, and a ratio of a length of the long side to a length of the short side is about 2.5 or less.

* * * * *